United States Patent [19]
Coy

[11] Patent Number: 6,107,891
[45] Date of Patent: Aug. 22, 2000

[54] INTEGRATED CIRCUIT AND METHOD FOR LOW NOISE FREQUENCY SYNTHESIS

[75] Inventor: Bruce H. Coy, San Diego, Calif.

[73] Assignee: Applied Micro Circuits Corporation, San Diego, Calif.

[21] Appl. No.: 09/306,553

[22] Filed: May 6, 1999

[51] Int. Cl.[7] .................................................. H03L 7/08
[52] U.S. Cl. .......................... 331/18; 331/1 A; 331/25
[58] Field of Search ................................ 331/1 A, 18, 25

[56] References Cited

U.S. PATENT DOCUMENTS

| | | | |
|---|---|---|---|
| 4,940,950 | 7/1990 | Helfrick | 331/2 |
| 4,965,533 | 10/1990 | Gilmore | 331/18 |
| 5,317,284 | 5/1994 | Yang | 331/2 |
| 5,420,545 | 5/1995 | Davis et al. | 331/18 |
| 5,764,111 | 6/1998 | Bushman | 331/1 A |
| 6,028,460 | 2/2000 | McCollum et al. | 331/11 |

*Primary Examiner*—Siegfried H. Grimm
*Attorney, Agent, or Firm*—Gray Cary Ware Freidenrich

[57] ABSTRACT

An integrated circuit device and method for synthesis of a signal having a desired frequency and low noise. The integrated circuit embodiment of the invention generally includes a phase locked loop (PLL) circuit used in conjunction with a frequency multiplier. Specifically, the integrated circuit embodiment includes a frequency multiplier connected to a first input of a phase detector, a low pass filter connected between the output of the phase detector and the input of a voltage controlled oscillator (VCO), and a frequency divider connected between the output of the VCO and a second input to the phase detector. The frequency multiplier produces a signal having a frequency that is a multiple of the frequency of a reference signal which is connected to the input of the frequency multiplier. For any desired output frequency, use of the multiplier results in a smaller divider ratio "n" in the PLL, thereby reducing the closed loop noise inside the PLL loop bandwidth. Other embodiments of the invention include a method for low noise frequency synthesis, and a method of low noise frequency synthesis for clocking data onto a SONET OC-48 channel. The invention provides the advantage of frequency synthesis with low noise.

27 Claims, 7 Drawing Sheets

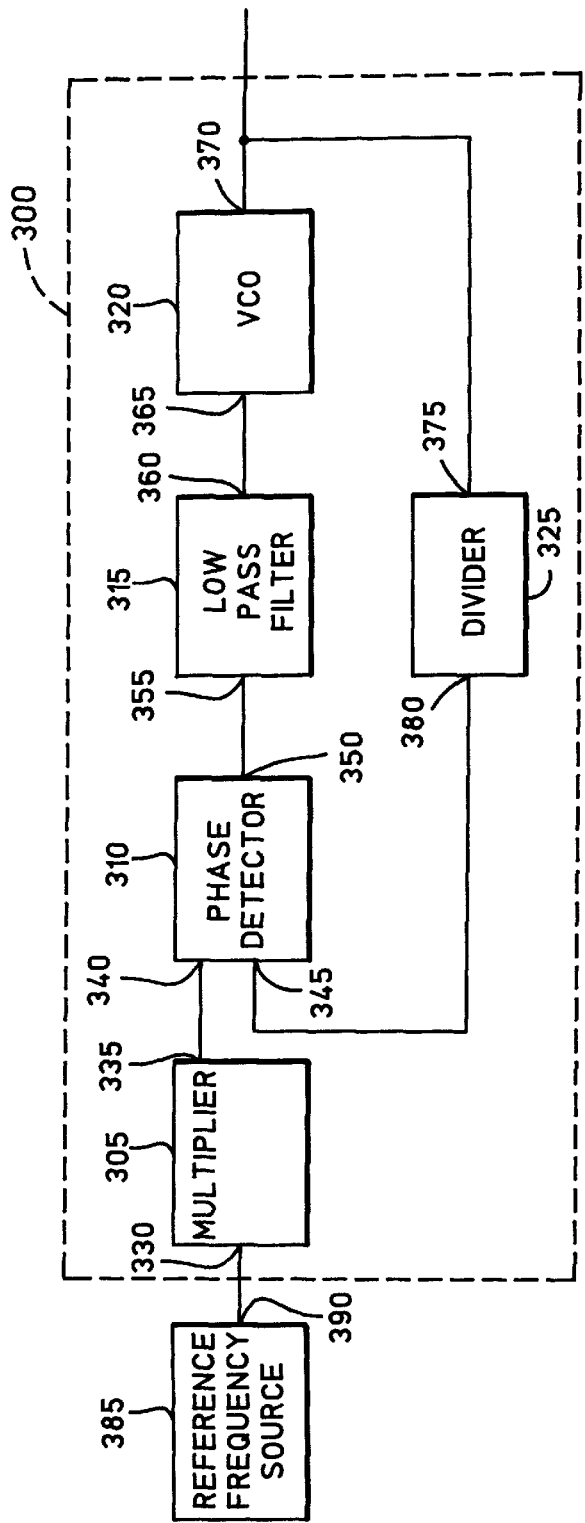
FIG. 3
FIG. 5
FIG. 4

INTEGRATED CIRCUIT AND METHOD FOR LOW NOISE FREQUENCY SYNTHESIS

BACKGROUND OF THE INVENTION

1. Field of the Invention

The invention relates to low noise frequency synthesis. More particularly, the invention concerns using a multiplier and a phase locked loop to synthesize a high frequency signal that has a desired frequency and low noise.

2. Description of the Related Art

In a variety of applications, there is a need to produce signals having specific frequencies. For example, specific carrier frequencies are often required for both analog and digital telecommunications.

A category of fiber-optic communication standards known as "SONET" (acronym for Synchronous Optical Network) provide for high speed digital communications at data rates ranging from about 51 megabits per second (or MHz) to about 39 gigabits per second (or GHz). Each of the SONET standards requires data to be clocked at a respective specific frequency. For example, the OC-48 SONET standard, which is typically used for wide area network (WAN) telecommunications, specifies a data rate of 2.48832 gigabits per second. Consequently, OC-48 telecommunications systems must have the ability to generate signals at the 2.48832 GHz rate to clock data to a laser that is connected to the fiber.

Phase locked loops (PLLs) have been widely used to synthesize signals having specific desired frequencies. In many applications the output of a PLL is referred to as a carrier, or as a synthesized clock frequency. A typical PLL 100 is illustrated in FIG. 1. The PLL includes a phase detector 105, a low pass filter 110, a voltage controlled oscillator (VCO) 115, and a divider 120. A reference signal having a known reference frequency (commonly produced by a crystal oscillator), is connected to a first input 125 of the phase detector. The output signal from the output 127 phase detector is connected to the input 130 of the low pass filter, and the output 132 of the low pass filter is connected to the input 135 of the VCO. The output 140 of the VCO, which is also the output of the PLL, is connected to the input of the divider 145, and the output of the divider 147 is connected to a second input 150 of the phase detector. The phase detector produces an output voltage that is representative of the phase difference between the reference signal and the output of the divider. The phase detector output voltage is filtered by the low pass filter, and is then used to control the output frequency of the VCO. If the frequency of the two input signals to the phase detector is the same, then the output voltage of the phase detector will remain unchanged, causing the output frequency of the VCO to remain unchanged. If the phase detector detects a phase (frequency) difference between the phase detector input signals, then the output voltage of the phase detector will change accordingly, thereby causing the frequency of the output of the VCO to increase or decrease to eliminate the phase difference between the input signals to the phase detector. In this way the frequency of the signal at the output of the divider is "locked" equal to the reference frequency. The output frequency of the VCO, which is the output of the PLL, can be locked to a frequency that is a multiple of the reference frequency by causing the divider to divide the VCO output signal by an integer value greater than one before the VCO output signal is input into the second input of the phase detector. The number that the VCO output signal is divided by is referred to as the PLL divider ratio "n".

Undesirably, PLLs produce noise in the PLL output signal which can degrade system performance. Typically, the most significant noise component in the output signals of PLLs is jitter, which can be described as variations in the time at which signal transitions take place. A common cause of jitter is duty cycle distortion. The frequency bandwidth, with reference to the carrier frequency, in which jitter can degrade performance is referred to as the jitter passband. For SONET, the jitter passband is from about 12 KHz (or generally, for practical purposes from 0 Hz) to about 20 MHz from the carrier frequency, and the major jitter components are inside the PLL closed loop bandwidth, which is approximately 1 MHz. The noise inside a PLL loop closed loop bandwidth is N0+20 log(n), with "N0" being the noise in the frequency reference signal, and "n" being the divider ratio of the PLL. Consequently, the closed loop noise inside a PLL loop bandwidth can be no better than 20 log(n). In order to reduce noise, it is desirable to minimize n. However, values of n that are larger than desirable are oftentimes required due to practical upper limits on the frequency of the reference signal that may exist, for example, as a result of crystal brittleness, vibration, or excessive cost. For example, the practical maximum reference signal frequency for SONET OC-48 systems is about 155.5 MHz, which requires a divider ratio n=16 in order to generate the required 2.488 GHz clock signal. In this instance the amount of noise above the noise reference floor is 20 log(16)=24 dB. System performance could be improved if the amount of noise could be reduced. Consequently, there is a need for a way to synthesize frequencies, but with reduced noise.

SUMMARY OF THE INVENTION

Broadly, the invention concerns an integrated circuit device and method for synthesis of a signal having a desired frequency and reduced noise.

One embodiment of the invention is an integrated circuit device that includes a phase locked loop (PLL) circuit used in conjunction with a frequency multiplier. More specifically, this embodiment of the invention includes a frequency multiplier connected to a first input of a phase detector, a low pass filter connected between the output of the phase detector and the input of a voltage controlled oscillator (VCO), and a frequency divider connected between the output of the VCO and a second input to the phase detector. The frequency multiplier multiplies the frequency of a reference signal that is connected to the input of the frequency multiplier by a number having an absolute value greater than one, to produce a signal having a frequency that is a multiple of the frequency of the reference signal. For any desired output frequency, use of the multiplier results in a smaller divider ratio "n" in the PLL, thereby reducing the closed loop noise inside the PLL loop bandwidth.

Other embodiments of the invention include a method for low noise frequency synthesis, and a method of low noise frequency synthesis for clocking data onto a SONET OC-48 channel. The method for low noise frequency synthesis includes multiplying the frequency of a reference signal by a number having an absolute value greater than one to produce a multiplier output signal, detecting the phase difference between the multiplier output signal and a feedback signal, generating a phase difference signal having a voltage that is indicative of the detected phase difference, passing the phase difference signal through a low pass filter, producing an oscillating output signal having a frequency that is a function of the voltage of the filtered phase difference signal, and dividing the frequency of the oscillating output signal by a number greater than one to produce the feedback signal.

The invention provides the advantage of frequency synthesis with low noise. Other advantages and benefits of the invention will be apparent from the following description.

BRIEF DESCRIPTION OF THE DRAWINGS

FIG. 3 is a block diagram of a low noise frequency synthesizer circuit in accordance with an illustrative embodiment of the invention.

FIG. 4 is a schematic diagram of a frequency multiplier in accordance with an illustrative embodiment of the invention.

FIG. 5 is a schematic diagram of another frequency multiplier in accordance with an illustrative embodiment of the invention.

DETAILED DESCRIPTION OF THE PREFERRED EMBODIMENTS

Figure 2:
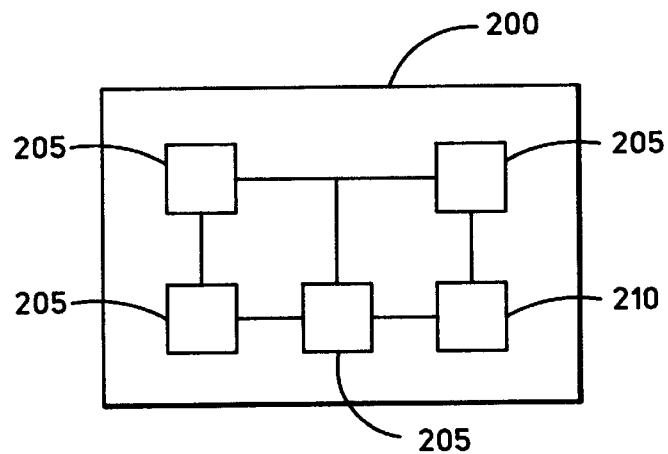
FIG. 2 is a plan view of an integrated circuit device in accordance with an illustrative embodiment of the invention.

Hardware Components and Interconnections
A. Plan View of Integrated Circuit Device FIG. 2 shows an integrated circuit device 200 in accordance with an illustrative embodiment of the invention. Integrated circuit device 200 includes at least one, and preferably numerous, circuits 205, which can generally be any type of digital and/or analog circuits, and which are preferably digital telecommunications circuits. At least one of the circuits 205 is, or includes, a low noise frequency synthesizer circuit 210. Some or all of the circuits of the integrated circuit device 200 may be interconnected. Integrated circuit device 200 can be implemented in any of a variety of digital logic families including, for example, TTL, ECL, CMOS (for example for cellular telephone applications) and NMOS, and is preferably implemented in TTL. Integrated circuit device 200 can be made with any of a number of known integrated circuit manufacturing processes. The low noise frequency synthesizer circuit 210 in FIG. 2 is preferably a low noise frequency synthesizer 300 as depicted in FIG. 3, which is discussed below.
B1. Low Noise Frequency Synthesizer Circuit FIG. 3 shows a low noise frequency synthesizer circuit 300 in accordance with an illustrative embodiment of the invention. Low noise frequency synthesizer 300 includes a frequency multiplier 305, a phase detector 310, a low pass filter 315, a voltage controlled oscillator 320, and a frequency divider 325.
B2. Low Noise Frequency Synthesizer Circuit: Frequency Multiplier Frequency multiplier 305 has an input 330 and an output 335. The input 330 is also the input of the low noise frequency synthesizer circuit 300. The frequency multiplier is configured to multiply the frequency of a reference signal received at the input of the frequency multiplier by a number having an absolute value greater than one. Preferably, the number having an absolute value greater than one is a positive integer. Preferably, the positive integer is 2.

The preferred embodiment of the frequency multiplier, which multiplies the frequency of the reference signal by 2, is illustrated in FIG. 4. The frequency multiplier 400 in FIG. 4 includes an exclusive-or (XOR) gate 405 having a first input 410, a second input 415, and an output 420. The frequency multiplier also includes a delay circuit 425 having an input 430 and an output 435. The output 435 of the delay circuit is connected to the first input 410 of the XOR gate, and the input 430 of the delay circuit is connected to the second input 415 of the XOR gate. The input 430 of the delay circuit is also the input to the frequency multiplier 400, and the output 420 of the XOR gate is also the output of the frequency multiplier 400. The delay circuit 425 is preferably configured to have a delay that delays signals having a frequency of about 155.5 MHz by one-quarter of the period of the 155.5 MHz signals. However, the delay of the delay circuit 425 could be adjusted to delay signals having frequencies other than 155.5 MHz by one-quarter of their periods. The delay circuit is preferably implemented with one or more logic gates, with the gate delay of the logic gates providing the delay of the delay circuit.

In the case when the reference signal has a frequency of about 155.5 MHz, the output of the XOR gate will have 155.5 MHz phase noise (a component of jitter), due to duty cycle distortion of the 155.5 MHz input frequency. However, this 155.5 MHz jitter component is filtered out by the narrow approximately 1 MHz bandwidth of the phase locked loop, so as to be attenuated to approximately −70 db in the jitter passband. A second noise source with regard to the signal purity of the multiplied frequency results from inaccuracy in the delay circuit. For example in the case where the reference frequency is doubled, the second noise source is the induced duty cycle distortion that is the result of the delay of the delay circuit not being precisely one-quarter of the period of the 155.5 MHz reference signal (which is approximately 1.6 nanoseconds, and which can be equivalently described as one-half the period of the output signal from the XOR gate). The induced duty cycle distortion resulting from the delay of the delay circuit not being precisely one-quarter of the period of the 155.5 MHz signal induces second harmonic distortion at approximately 622 MHz in the output signal from the XOR gate. However, this noise component is also substantially attenuated due to filtering resulting from the narrow bandwidth of the phase locked loop. Thus, although multiplying the frequency of the reference signal by two will also generally double the noise, the added noise is outside of the jitter pass band, and therefore does not negatively impact performance.

An alternative embodiment of the frequency multiplier, referred to as a "Gilbert mixer", is illustrated in FIG. 5. The frequency multiplier 500 in FIG. 5 includes a local oscillator 505 having an output 510. Frequency multiplier 500 also includes a mixer 515 having a reference frequency input 520

(which is also the input of the frequency multiplier), an output 525 (which is also the output of the frequency multiplier), and a local oscillator input 530 connected to the output of the local oscillator. If the frequency of the local oscillator is set equal to the frequency of the reference signal, then a signal having a frequency that is the sum of the frequency of the reference signal and the frequency of the local oscillator can be obtained at the output of the mixer. In this case, the frequency of the frequency multiplier output signal will be two times the frequency of the reference signal.

The reference frequency could be multiplied by multiples of four or eight, for example, by cascading frequency multipliers like the XOR frequency multiplier 400, or by cascading Gilbert mixers, or by cascading a combination of these two types of frequency multipliers. Other circuits, for example mixers, that could be used for multiplying the frequency of the reference signal by two, four, eight, or by other numbers, are widely known in the art.

B3. Low Noise Frequency Synthesizer Circuit: Phase Detector

Low noise frequency synthesizer circuit 300 includes phase detector 310 which has a first input 340, a second input 345, and an output 350. The output 335 of the frequency multiplier is connected directly to the first input 340 of the phase detector.

B4. Low Noise Frequency Synthesizer Circuit: Low Pass Filter

Low noise frequency synthesizer circuit 300 includes low pass filter 315 which has an input 355 and an output 360. The output 350 of the phase detector is connected to the input 355 of the low pass filter.

B5. Low Noise Frequency Synthesizer Circuit: Voltage Controlled Oscillator

Low noise frequency synthesizer circuit 300 includes voltage controlled oscillator (VCO) 320, which has an input 365 and an output 370. The output 360 of the low pass filter is connected to the input 365 of the VCO. The output 370 of the VCO is also the output of the low noise frequency synthesizer circuit 300. Thus, the signal at the output of the VCO is the output signal produced by the low noise frequency synthesizer circuit 300.

Although the low noise frequency synthesizer of the invention is often described herein with reference to frequencies specified by SONET standards, the low noise frequency synthesizer of the invention can be used to synthesize signals of any frequency, with the frequency limits of the generated signals being constrained only by the limits of the implementing hardware. For example, the low noise frequency synthesizer circuit 300 can generate frequencies specified by SONET such as between about 51.84 MHz and about 2.488 GHz, and/or even higher frequencies specified by SONET such as between about 2.488 GHz and about 38.81 GHz. Additionally, the low noise frequency synthesizer circuit of the invention can also generate frequencies that are lower than 51.84 MHz, and higher than 38.81 GHz. Preferably the low noise frequency synthesizer circuit 300 generates an output signal having a frequency of about 2.488 GHz, which is the service speed specified for SONET OC-48.

B6. Low Noise Frequency Synthesizer Circuit: Frequency Divider

Low noise frequency synthesizer circuit 300 includes a frequency divider 325 having an input 375 and an output 380. The output 370 of the voltage controlled oscillator is connected to the input 375 of the frequency divider, and the output 380 of the frequency divider is connected to the second input 345 of the phase detector. The divider divides the frequency of the signal received at the input of the divider by a number greater than one (referred to as the divider ratio or as the divisor), and produces at the output of the divider a signal having a frequency that is equal to the frequency of the signal at the input to the divider divided by the divider ratio. Preferably the divider ratio is an integer. Preferably the integer is 8.

C. Low Noise Frequency Synthesizer System

Another illustrative embodiment of the invention is a low noise frequency synthesizer system, which includes all of the elements of the low noise frequency synthesizer circuit 300 shown in FIG. 3, plus the reference frequency source 385 that is also shown in FIG. 3. Thus, the low noise frequency synthesizer system includes frequency multiplier 305, phase detector 310, low pass filter 315, voltage controlled oscillator 320, and frequency divider 325, which are connected as described above, and also includes reference frequency source 385. The reference frequency source has an output 390 that is connected to the input 330 of the frequency multiplier. The reference frequency source can be any component or circuit that produces a signal having a desired reference frequency. Preferably, the reference frequency source is a crystal. Preferably the signal produced by the reference frequency source has a frequency of about 155.5 MHz.

Methods

Other aspects of the invention concern a method for low noise frequency synthesis, and a method of low noise frequency synthesis for clocking data onto a SONET OC-48 channel. The methods may be practiced with any suitable hardware configurations. For clarity of explanation, but with no limitation intended thereby, the tasks of the methods are described in the context of the hardware described above.

A. Method for Low Noise Frequency Synthesis

Figure 6:
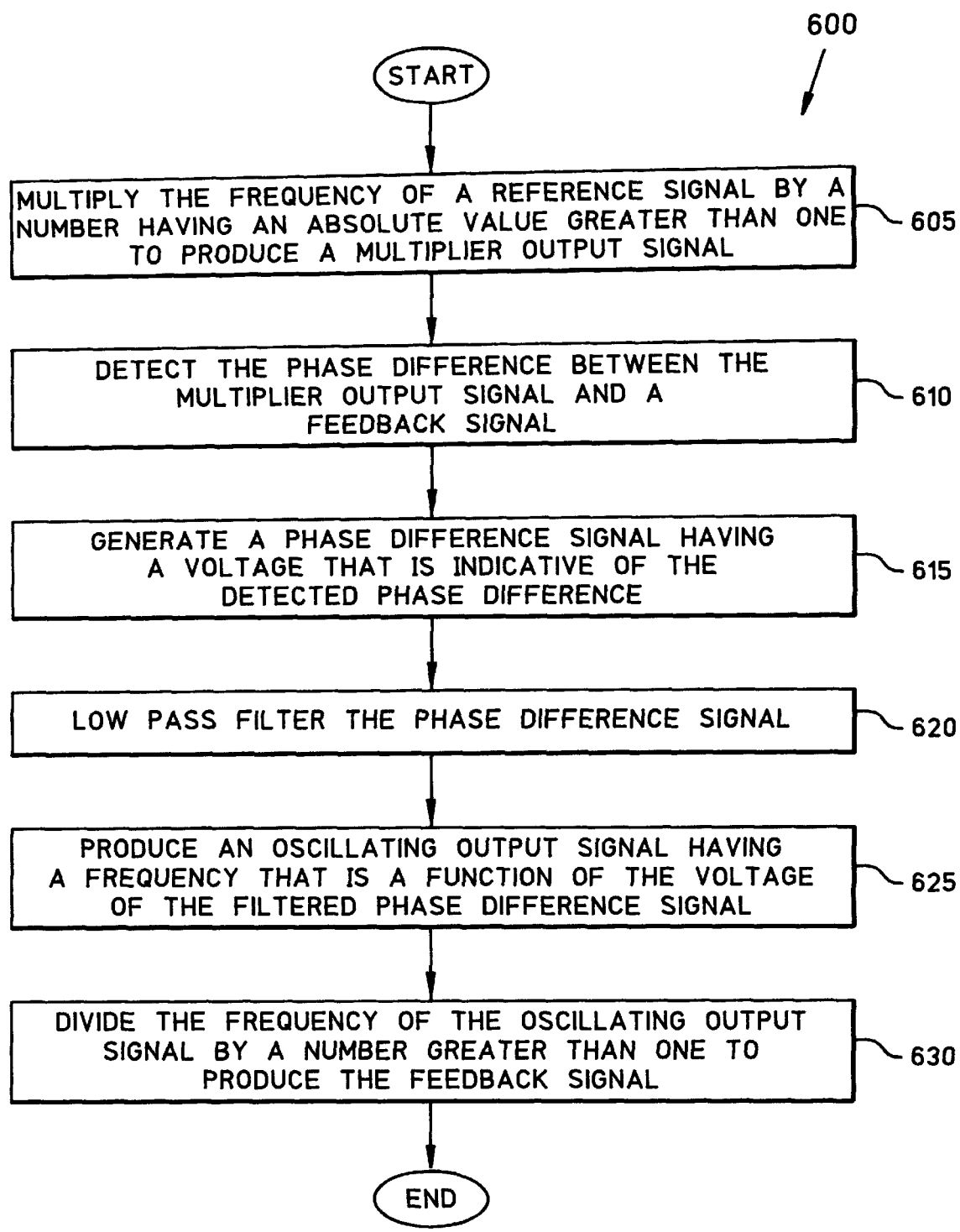
FIG. 6 is a flow chart of a method for low noise frequency synthesis in accordance with an illustrative embodiment of the invention.

The method for low noise frequency synthesis is illustrated by the tasks 600 of the flowchart in FIG. 6. In task 605, the frequency of a reference signal is multiplied by a number having an absolute value greater than one to produce a multiplier output signal. In task 610, the phase difference between the multiplier output signal and a feedback signal is detected. In task 615, a phase difference signal that has a voltage that is indicative of the detected phase difference is generated. In task 620, the phase difference signal is low pass filtered. In task 625, an oscillating output signal having a frequency that is a function of the voltage of the filtered phase difference signal is produced. In task 630, the frequency of the oscillating output signal is divided by a number greater than one to produce the feedback signal.

Figure 7:
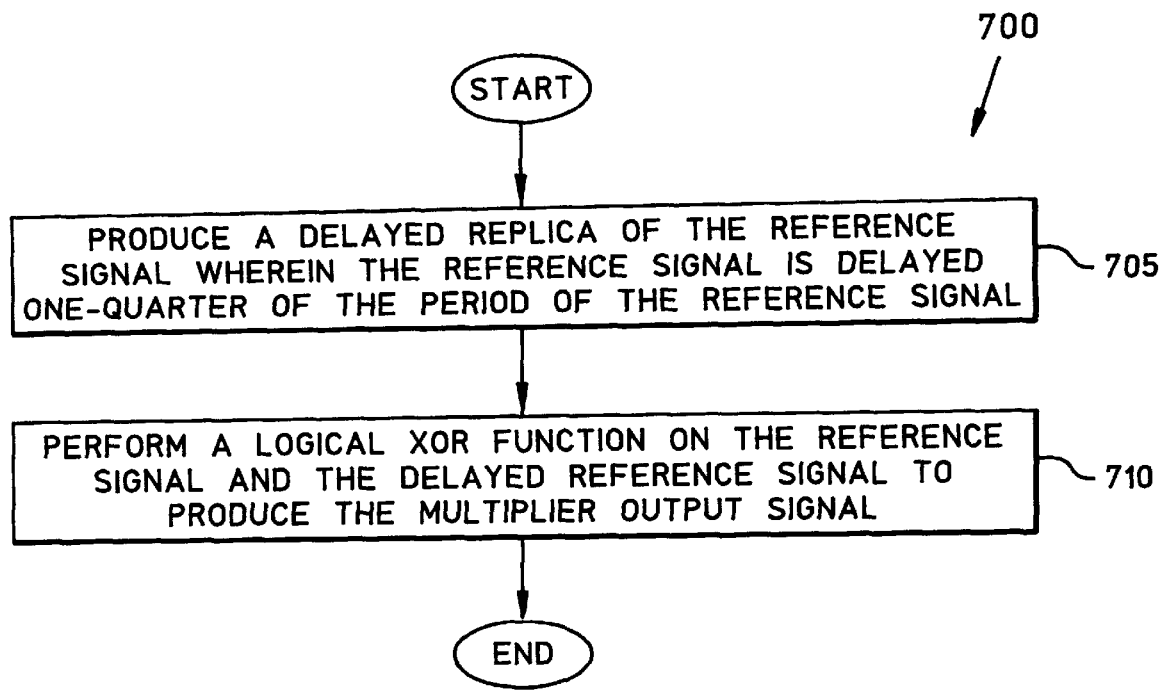
FIG. 7 is a flow chart illustrating tasks for multiplying the frequency of a reference signal in accordance with an illustrative embodiment of the invention.

Task 605 of multiplying the frequency of a reference signal by a number having an absolute value greater than one to produce a multiplier output signal may include the tasks 700 of the flowchart in FIG. 7. In task 705, a delayed replica of the reference signal wherein the reference signal is delayed one-quarter of the period of the reference signal, is produced. In task 710, a logical exclusive-or (XOR) function is performed on the reference signal and the delayed reference signal to produce the multiplier output signal.

Figure 8:
FIG. 8 is a flow chart illustrating the task of generating the reference signal in accordance with an illustrative embodiment of the invention.

The method for low noise frequency synthesis illustrated in FIG. 6 may also include the task of generating the reference signal, as illustrated by task 805 in FIG. 8.

Figure 9:
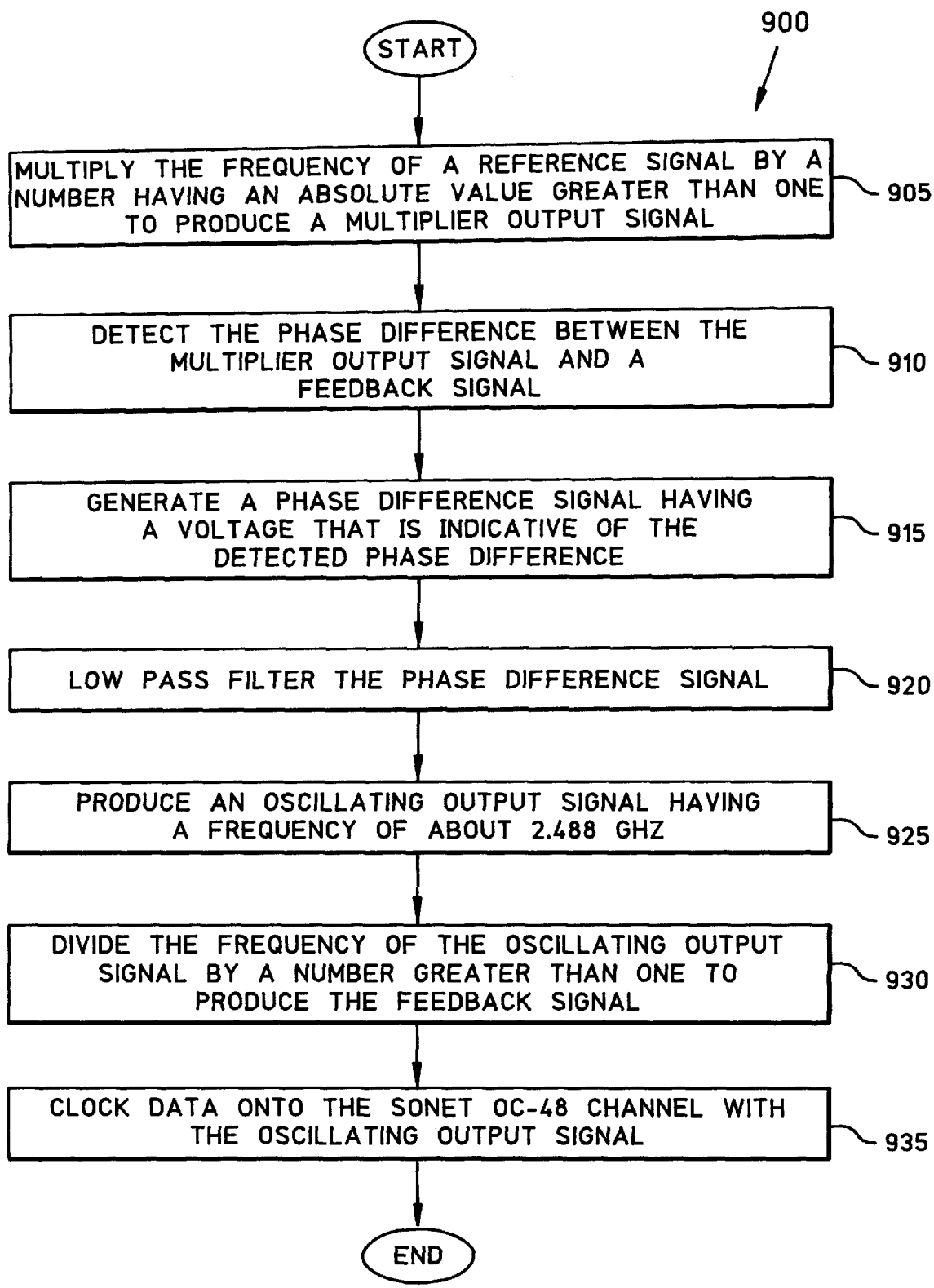
FIG. 9 is a flow chart of a method for low noise frequency synthesis for clocking data onto a SONET OC-48 channel in accordance with an illustrative embodiment of the invention.

B. Method of Low Noise Frequency Synthesis for Clocking Data onto a SONET OC-48 Channel The method of low noise frequency synthesis for clocking data onto a SONET OC-48 channel is illustrated by the tasks 900 of the flowchart in FIG. 9. In task 905, the frequency of a reference signal is multiplied by a number having an absolute value greater than one to produce a multiplier output signal. In task 910, the phase difference between the multiplier output signal and a feedback signal is detected. In task 915, a phase difference signal that has a voltage that is indicative of the detected phase difference is generated. In task 920, the phase difference signal is low pass filtered. In task 925, an oscillating output signal having a frequency of about 2.488 GHz is produced, with the 2.488 GHz frequency of the oscillating output signal being a function of the voltage of the filtered phase difference signal. In task 930, the frequency of the oscillating output signal is divided by a number greater than one to produce the feedback signal. In task 935, the oscillating output signal is used to clock data onto the SONET OC-48 channel.

Jitter Reduction Resulting From Use of the Invention

Figure 10A:
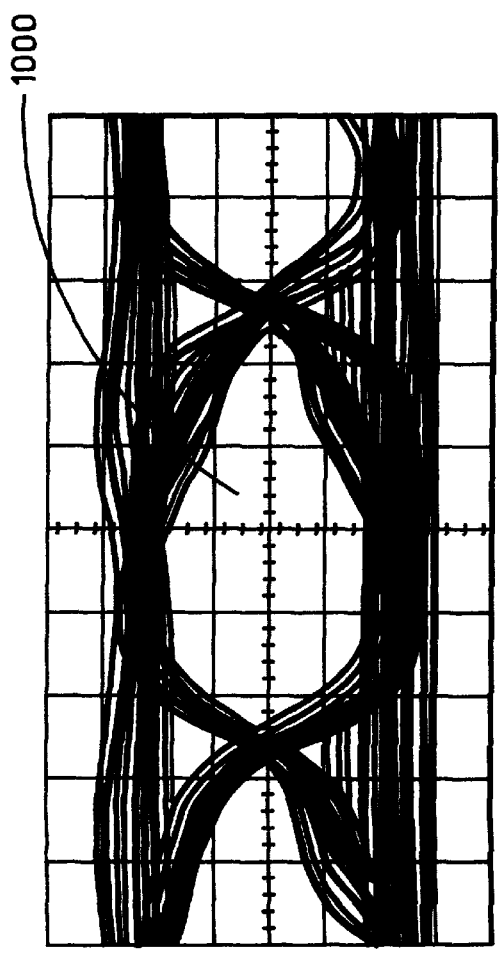
FIG. 10A is a graph depicting digital signals having a substantial amount of jitter.
Figure 10B:
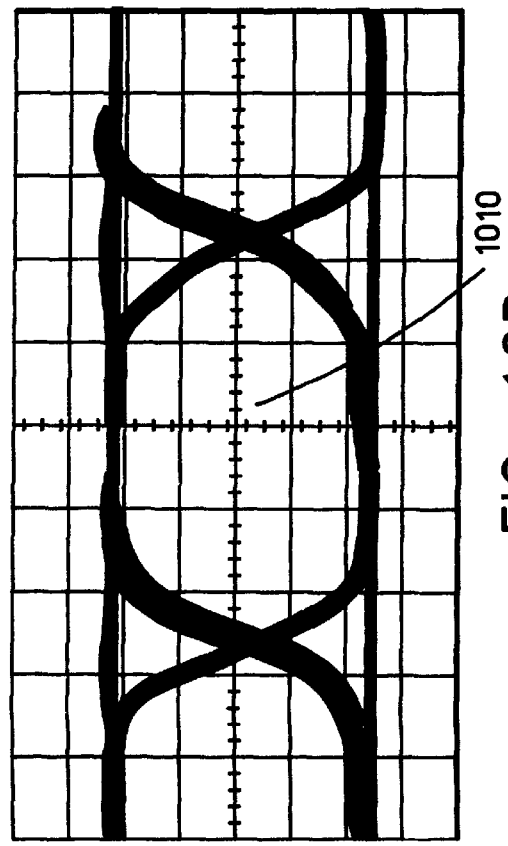
FIG. 10B is a graph depicting digital signals having considerably less jitter than the signals shown in FIG. 10A.

In fiber optic communications systems, there are three main components of noise: (1) optics, (2) the laser driver, and (3) clock noise (noise in the clock signal that is clocking the data into the communication channel). The present invention is useful for significantly reducing the clock noise, which is generally manifested as jitter. FIG. 10A shows transitions of digital signals with a substantial amount of jitter. Generally, it is desirable to maximize the eye openings such as eye opening 1000 in FIG. 10A, by reducing the amount of jitter. FIG. 10B shows transitions of digital signals with the jitter significantly reduced in comparison with the amount of jitter shown in FIG. 10A. Due to the jitter reduction, the eye opening 1010 in FIG. 10B is significantly larger than the opening 1000 in FIG. 10A. The jitter reduction may also be referred to as phase noise reduction. The amount of jitter reduction between FIGS. 10A and 10B is representative of the amount of jitter reduction that may be realized when the invention is used to synthesize a 2.488 GHz signal for clocking data into a SONET OC-48 channel, in the case where the frequency multiplier multiplies the frequency of the reference signal by 2 and where the frequency of the VCO output signal is divided by 8 by the divider.

Figure 11:
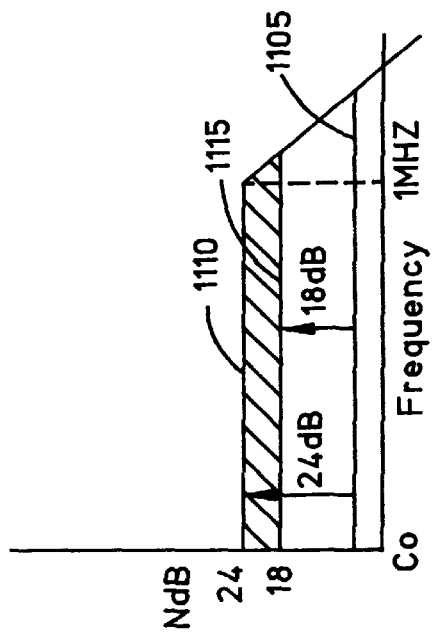
FIG. 11 is a graph illustrating the reduction in noise resulting from use of the invention.

FIG. 11 is a graph illustrating an example of the reduction in noise (N) over the approximately 1 MHz PLL bandwidth from the carrier frequency $C_0$, that results from use of the invention. As mentioned above, to synthesize the 2.488 GHz signal needed for clocking data onto a SONET OC-48 channel, it is necessary to divide a 1.55.5 MHz reference signal frequency by a divider ratio of 16. In this case the noise above the noise reference floor (N0) 1105 is 20 log(16)=24 dB, as indicated by line 1110 in FIG. 11. By using the invention, with the multiplier multiplying the frequency of the reference signal by 2, a smaller divider ratio of 8 is used, causing the noise above the reference noise floor to be reduced to 20 log(8)=18 dB, as indicated by line 1115 in FIG. 11, which is an improvement of 6 dB. If the value of the reference noise floor N0 is −123 dB, then the noise floor minimum for the case where n=16 is −123 dB+24 dB=−99 dB, and for the case where n=8 is −123 dB+18 dB=−105 dB. The noise power is given by the integral $\int N_{OP}/C_0 \, df$ with the integral being evaluated over the jitter passband from a frequency $f_A$ to a frequency $f_B$, and where $N_{OP}$ is the noise power, and where $C_0$ is the carrier frequency. Evaluating this integral for the first case above where the invention is not used and where n=16, over a jitter passband from 0 to 20 MHz, assuming constant noise density, gives $(1.4/2\pi)((10^{-9.9})(2\times10^7))^{1/2}=0.011$ UI (unit intervals) RMS. (A unit interval (UI) is defined as the period of the output signal of the frequency synthesizer.) Evaluating this integral for the second case above where the invention is used and where n=8, over a jitter passband from 0 to 20 MHz, assuming constant noise density, gives $(1.4/2\pi)((10^{-10.5})(2\times10^7))^{1/2}=0.0056$ UI (unit intervals) RMS, which is approximately one-half the 0.011 UI RMS value that results when the invention is not used.

Figure 1:
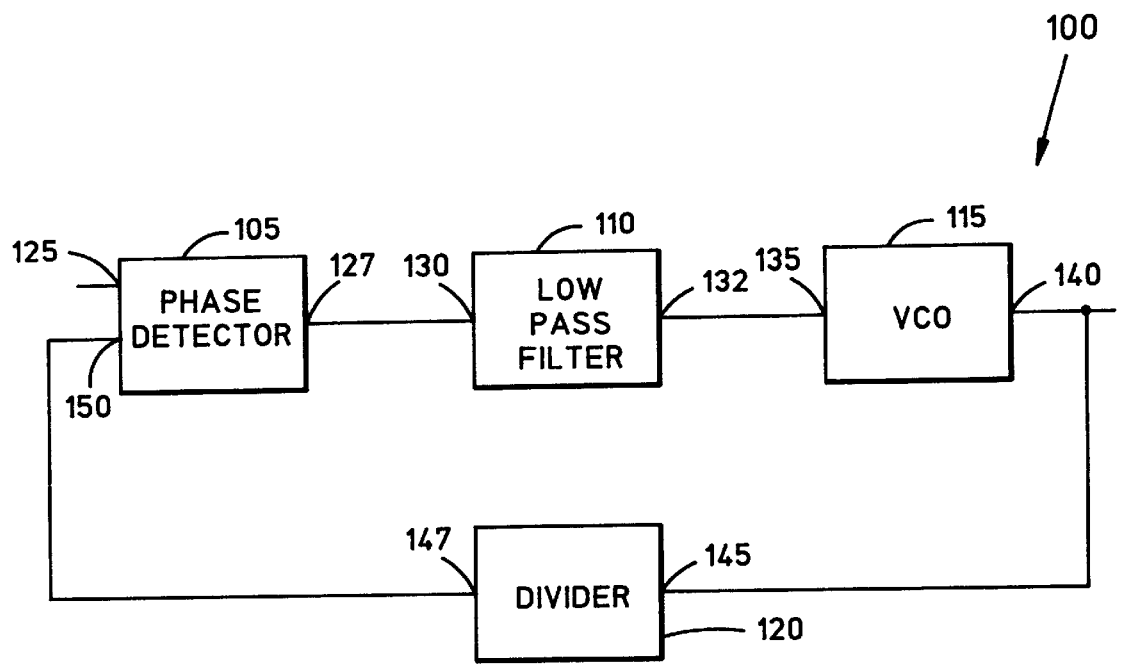
FIG. 1 is a block diagram of a prior art phase locked loop.
Figure 12:
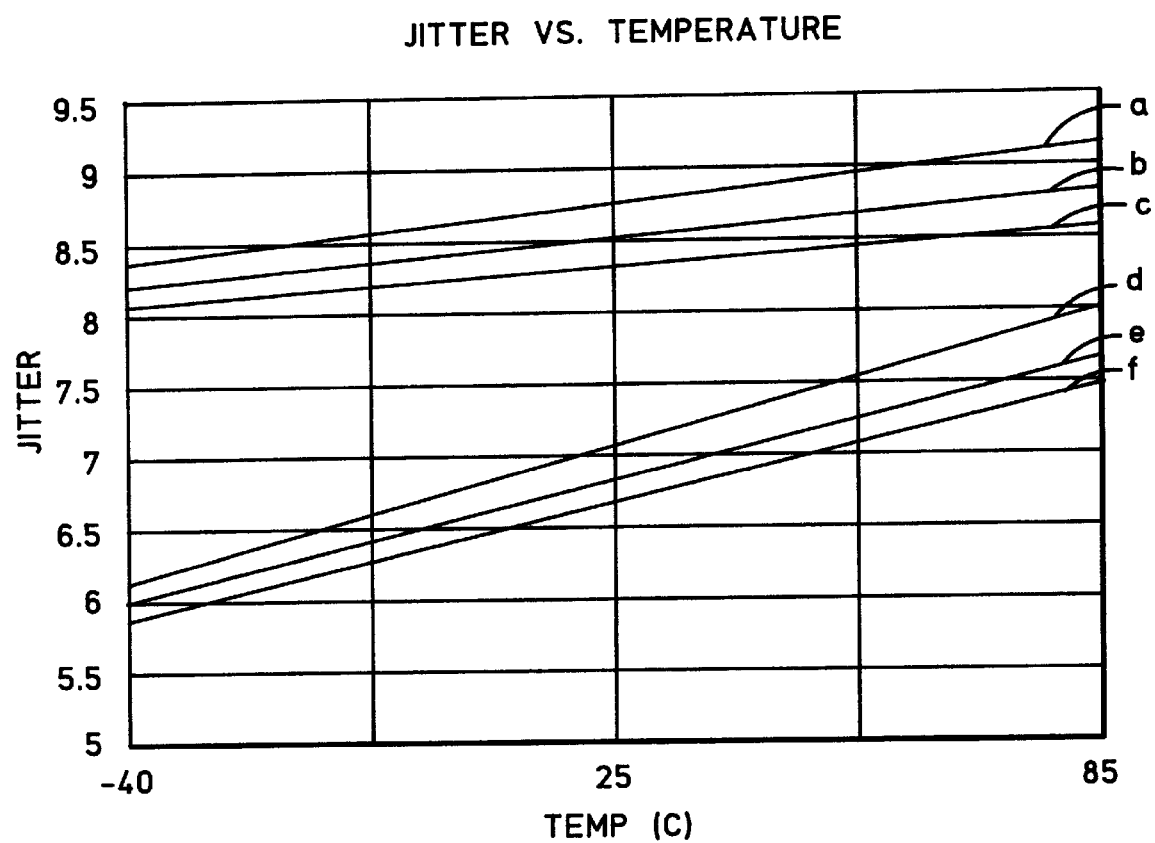
FIG. 12 is a graph of jitter versus temperature for different phase locked loop divider ratios, and for different voltages.

In FIG. 12, plots a, b, and c illustrate jitter versus temperature with supply voltages of 3.13 volts, 3.3 volts, and 3.47 volts respectively, when a prior art circuit similar to the PLL circuit in FIG. 1 is used to synthesize a 2.488 GHz signal. In comparison, plots d, e, and f illustrate jitter versus temperature with supply voltages of 3.13 volts, 3.3 volts, and 3.47 volts respectively, when the low noise frequency synthesizer circuit of the invention is used to synthesize a 2.488 GHz signal, in the case where the frequency multiplier multiplies the frequency of the reference signal by 2 and where the frequency of the VCO output signal is divided by 8 by the divider. In FIG. 12, the jitter is indicated in milli unit intervals (mUI). (For a 2.488 GHz signal, 1 UI is approximately equal to 400 picoseconds.) Comparison of plots a, b, and c, with respective plots d, e, and f illustrates the significant jitter reduction that results from use of the invention. Measured data, such as the data in FIG. 12, has consistently demonstrated that use of the invention results in an improvement of approximately 30% (30% less jitter) for integrated RMS jitter over the passband.

Conclusion

Illustrative embodiments of the invention, including what are presently considered to be the preferred embodiments of the invention, have been described herein. It will be apparent to those skilled in the art that various changes and modifications can be made without departing from the scope of the invention as defined by the appended claims. Consequently, it is not intended that the invention should be limited to only the embodiments discussed above. Rather, the invention should be limited only by the scope of the claims.

What is claimed is:

1. An integrated circuit device comprising:
   at least one circuit, the at least one circuit including at least one circuit that is a low noise frequency synthesizer circuit comprising:
   a frequency multiplier having an input and an output, the frequency multiplier being configured to multiply the frequency of a reference signal by a number having an absolute value greater than one;
   a phase detector having a first input, a second input, and an output, the output of the frequency multiplier being connected to the first input of the phase detector;
   a low pass filter having an input and an output, the output of the phase detector being connected to the input of the low pass filter;
   a voltage controlled oscillator having an input and an output, the output of the low pass filter being connected to the input of the voltage controlled oscillator; and
   a frequency divider having an input and an output, the output of the voltage controlled oscillator being connected to the input of the frequency divider, the output of the frequency divider being connected to the second input of the phase detector.

2. The integrated circuit device of claim 1 wherein the frequency multiplier multiplies frequencies by 2 and wherein the frequency divider divides frequencies by 8.

3. The integrated circuit device of claim 1 wherein the frequency multiplier multiplies frequencies by 4 and wherein the frequency divider divides frequencies by 4.

4. The integrated circuit device of claim 1 wherein the frequency multiplier multiplies frequencies by 8 and wherein the frequency divider divides frequencies by 2.

5. The integrated circuit device of claim 2 wherein the voltage controlled oscillator generates a signal at the output of the voltage controlled oscillator having a frequency of about 2.488 GHz.

6. The integrated circuit device of claim 2 wherein the voltage controlled oscillator generates a signal at the output of the voltage controlled oscillator having a frequency of at least about 2.488 GHz.

7. The integrated circuit device of claim 2 wherein the voltage controlled oscillator generates a signal at the output of the voltage controlled oscillator having a frequency between about 51.84 MHz and about 2.488 GHz.

8. The integrated circuit device of claim 5 wherein the frequency multiplier comprises:
   an XOR gate having a first input, a second input, and an output;
   a delay circuit having an input and an output, the output of the delay circuit being connected to the first input of the XOR gate, and the input of the delay circuit being connected to the second input of the XOR gate, the delay circuit being configured to delay signals that have a frequency of about 155.5 MHz by one-quarter of a period.

9. The integrated circuit device of claim 8 wherein the delay circuit comprises at least one logic gate.

10. The integrated circuit device of claim 2 wherein the frequency multiplier comprises:
    a local oscillator having an output; and
    a mixer having a reference frequency input that is the input of the frequency multiplier, an output that is the output of the frequency multiplier, and a local oscillator input connected to the output of the local oscillator.

11. An integrated circuit device consisting of:
    at least one circuit, the at least one circuit including at least one circuit that is a low noise frequency synthesizer circuit consisting of:
        a frequency multiplier having a single input and a single output, the frequency multiplier being configured to multiply the frequency of a reference signal by a number having an absolute value greater than one;
        a phase detector having a first input, a second input, and an output, the output of the frequency multiplier being connected to the first input of the phase detector;
        a low pass filter having an input and an output, the output of the phase detector being connected to the input of the low pass filter;
        a voltage controlled oscillator having an input and an output, the output of the low pass filter being connected to the input of the voltage controlled oscillator; and
        a frequency divider having an input and an output, the output of the voltage controlled oscillator being connected to the input of the frequency divider, the output of the frequency divider being connected to the second input of the phase detector.

12. The integrated circuit device of claim 11 wherein the frequency multiplier multiplies frequencies by 2 and wherein the frequency divider divides frequencies by 8.

13. The integrated circuit device of claim 12 wherein the voltage controlled oscillator generates a signal at the output of the voltage controlled oscillator having a frequency of about 2.488 GHz.

14. A low noise frequency synthesizer system comprising:
    a frequency multiplier having an input and an output, the frequency multiplier being configured to multiply the frequency of a reference signal by a number having an absolute value greater than one;
    a phase detector having a first input, a second input, and an output, the output of the frequency multiplier being connected to the first input of the phase detector;
    a low pass filter having an input and an output, the output of the phase detector being connected to the input of the low pass filter;
    a voltage controlled oscillator having an input and an output, the output of the low pass filter being connected to the input of the voltage controlled oscillator;
    a frequency divider having an input and an output, the output of the voltage controlled oscillator being connected to the input of the frequency divider, the output of the frequency divider being connected to the second input of the phase detector; and
    a reference frequency source connected to the input of the frequency multiplier.

15. The low noise frequency synthesizer system of claim 14 wherein the reference frequency source is a crystal.

16. The low noise frequency synthesizer system of claim 15 wherein the reference frequency source produces a signal having a frequency of about 155.5 MHz.

17. A method for low noise frequency synthesis, comprising:
    multiplying the frequency of a reference signal by a number having an absolute value greater than one to produce a multiplier output signal;
    detecting the phase difference between the multiplier output signal and a feedback signal;
    generating a phase difference signal having a voltage that is indicative of the detected phase difference;
    low pass filtering the phase difference signal;
    producing an oscillating output signal having a frequency that is a function of the voltage of the filtered phase difference signal; and
    dividing the frequency of the oscillating output signal by a number greater than one to produce the feedback signal.

18. The method of claim 17 wherein the frequency of the reference signal is multiplied by 2 to produce the multiplier output signal and wherein the frequency of the oscillating output signal is divided by 8 to produce the feedback signal.

19. The method of claim 17 wherein the frequency of the reference signal is multiplied by 4 to produce the multiplier output signal and wherein the frequency of the oscillating output signal is divided by 4 to produce the feedback signal.

20. The method of claim 17 wherein the frequency of the reference signal is multiplied by 8 to produce the multiplier output signal and wherein the frequency of the oscillating output signal is divided by 2 to produce the feedback signal.

21. The method of claim 18 wherein the oscillating output signal has a frequency of about 2.488 GHz.

22. The method of claim 18 wherein the oscillating output signal has a frequency of at least about 2.488 GHz.

23. The method of claim 18 wherein the oscillating output signal has a frequency between about 51.84 MHz and about 2.488 GHz.

24. The method of claim 21 wherein multiplying the frequency of a reference signal by a number having an absolute value greater than one to produce a multiplier output signal comprises:

producing a delayed replica of the reference signal wherein the reference signal is delayed one-quarter of the period of the reference signal;

performing a logical XOR function on the reference signal and the delayed reference signal to produce the multiplier output signal.

25. The method of claim 24 further comprising generating the reference signal.

26. The method of claim 25 wherein the reference signal has a frequency of about 155.5 MHz.

27. A method of low noise frequency synthesis for clocking data onto a SONET OC-48 channel, comprising:

multiplying the frequency of a reference signal by a number having an absolute value greater than one to produce a multiplier output signal;

detecting the phase difference between the multiplier output signal and a feedback signal;

generating a phase difference signal having a voltage that is indicative of the detected phase difference;

low pass filtering the phase difference signal;

producing an oscillating output signal having a frequency of about 2.488 GHz, the frequency of the oscillating output signal being a function of the voltage of the filtered phase difference signal;

dividing the frequency of the oscillating output signal by a number greater than one to produce the feedback signal; and clocking the data onto the SONET OC-48 channel with the oscillating output signal.

\* \* \* \* \*